(12) United States Patent
Rastegar et al.

(10) Patent No.: US 7,777,396 B2
(45) Date of Patent: Aug. 17, 2010

(54) IMPACT POWERED DEVICES

(75) Inventors: Jahangir S. Rastegar, Stony Brook, NY (US); Thomas Spinelli, East Northport, NY (US)

(73) Assignee: Omnitek Partners LLC, Bay Shore, NY (US)

( * ) Notice: Subject to any disclaimer, the term of this patent is extended or adjusted under 35 U.S.C. 154(b) by 238 days.

(21) Appl. No.: 11/447,788

(22) Filed: Jun. 6, 2006

(65) Prior Publication Data

US 2007/0278902 A1 Dec. 6, 2007

(51) Int. Cl.
H01L 41/04 (2006.01)
(52) U.S. Cl. ........................ 310/339; 310/329

(58) Field of Classification Search ........... 310/329, 310/339
See application file for complete search history.

(56) References Cited

U.S. PATENT DOCUMENTS

| 2003/0041767 A1* | 3/2003 | Rastegar et al. | 102/207 |
| 2004/0041498 A1* | 3/2004 | Sakai | 310/339 |

* cited by examiner

Primary Examiner—Walter Benson
Assistant Examiner—Derek J Rosenau

(57) ABSTRACT

A device including: a housing; a powered element disposed on or in the housing; and an impact power producing element housed on or in the housing and operatively connected to the powered element, the impact power producing element producing power upon an impact of at least a portion of the housing with another surface.

14 Claims, 5 Drawing Sheets

IMPACT POWERED DEVICES

BACKGROUND OF THE INVENTION

1. Field of the Invention

The present invention relates generally to devices powered by energy generated by impacts and, more particularly, to consumer devices, such as a flashlight powered by an impact.

2. Prior Art

In general, all chemical batteries contain hazardous and/or corrosive chemicals, have a relatively short shelf life, are relatively expensive and introduce waste disposal problems, with the latter being particularly the case for lithium based batteries and most rechargeable batteries. To satisfy the need for alternative power source solutions for various devices in general and for flashlights in particular, products have been developed that utilize coil and magnets to generate electrical energy. Bicycle dynamo and cranking type of dynamos have long been used to generate electrical energy. Similar coil and magnet generators have also been used in flashlights in the form of rotary crank type and sliding shaking type generators. The crank type generators are relatively heavy and bulky and when designed to be small as is needed for flashlights, they are cumbersome and tiring to crank. The shake type linear motion generators generate very small amounts of electrical energy during each shaking cycle, and are also relatively heavy. Each of such cranking and shaking devices are limited by the physical ability of the person providing the energy to crank or shake the device. In addition, the availability of low cost LED (Light Emitting Diode) lights that consume significantly less electrical energy than conventional light bulbs have made flashlights that harvest energy from the environment, including the user induced actions, much more practical. This is particularly the case for flashlights that are to be used in emergency situations and/or for use in locations where electricity is not available such as in the beach, during hiking, and the like, where flashlights with rechargeable batteries are not practical.

The only source of energy that is available to humans that could be harvested is mechanical energy. The energy to be harvested by any energy harvesting power source is mechanical in nature. The difference between any such energy harvesting power sources is: 1) in the method of transferring mechanical energy to the energy harvesting device; and 2) in the method of transforming mechanical energy to electrical energy.

A superior method of transferring mechanical energy to the energy harvesting device is ergonomic and does not put undue stress on the user limbs and joints. The method must also be efficient in making available the work done by the human subject to mechanical energy that can be harvested. In addition, the transferred mechanical energy is preferably stored in an intermediate medium to lengthen the period of time available for its conversion to electrical energy since it is generally easier and more efficient to convert mechanical energy to electrical energy and store it in electrical storage devices such as capacitors and rechargeable batteries. The means of transforming mechanical energy to electrical energy is also desired to produce high enough voltage to make the process of charging rechargeable batteries and/or capacitors more efficient.

A need therefore exists for methods and related devices for efficient transfer of the work done by human muscles to mechanical energy that can be harvested efficiently and transformed into electrical energy.

SUMMARY OF THE INVENTION

Accordingly, a device is provided. The device comprising: a housing; a powered element disposed on or in the housing; and an impact power producing element housed on or in the housing and operatively connected to the powered element, the impact power producing element producing power upon an impact of at least a portion of the housing with another surface.

The powered element can be a light source. The light source can be one or more light emitting diodes.

The device can further comprise one or more of an energy harvesting device and an energy storage device for receiving an input from the impact power producing element and delivering an output to the powered element.

The housing can comprise an impact receiving surface. The impact receiving surface can be an end of the housing.

The impact power producing element can comprise a mass and one or more spring elements connected at a first end to the mass and at a second end directly or indirectly to the housing. The impact power producing element can comprises two spring elements each connected at a first end to the mass and each connected at a second end directly or indirectly to the housing. The mass and one or more spring elements can comprise an integral spring winding having one or more spring element portions and a mass portion in which the mass portion is wound more tightly than the one or more spring portions. The impact power producing element can further comprise a piezoelectric element disposed at the second end of each of the one or more spring elements to produce power upon the action of a corresponding spring element thereon. The impact power producing element can further comprise one or more magnet elements and a coil, wherein the impact causes a relative motion between the one or more magnet elements and the coil. The one or more magnet elements can be at least the mass. The one or more spring elements can comprise one or more cantilever beams and the impact power producing element can comprise a piezoelectric element disposed one or more surfaces of the one or more cantilever beams.

Also provided is a flashlight. The flashlight comprising: a housing; a light source disposed in the housing; and an impact power producing element housed in the housing and operatively connected to the light source, the impact power producing element producing power upon an impact of at least a portion of the housing with another surface.

The light source can be one or more light emitting diodes.

The flashlight can further comprise one or more of an energy harvesting device and an energy storage device for receiving an input from the impact power producing element and delivering an output to the light source.

The housing can comprises an impact receiving surface. The impact receiving surface can be an end of the housing.

The impact power producing element can comprise a mass and one or more spring elements connected at a first end to the mass and at a second end directly or indirectly to the housing. The impact power producing element can comprise two spring elements each connected at a first end to the mass and each connected at a second end directly or indirectly to the housing. The mass and one or more spring elements can comprise an integral spring winding having one or more spring element portions and a mass portion in which the mass portion is wound more tightly than the one or more spring portions. The impact power producing element can further comprise a piezoelectric element disposed at the second end of each of the one or more spring elements to produce power upon the action of a corresponding spring element thereon. The impact power producing element can further comprise one or more magnet elements and a coil, wherein the impact causes a relative motion between the one or more magnet elements and the coil. The one or more magnet elements can be at least the mass. The one or more spring elements can comprise one or more cantilever beams and the impact power producing element can comprise a piezoelectric element disposed on one or more surfaces of the one or more cantilever beams.

Still further provided is a method for powering a device. The method comprising: impacting a portion of the device against a surface; converting the impacting to electrical energy; and providing at least a portion of the electrical energy to at least one powered element associated with the device.

The method can further comprise storing at least a portion of the electrical energy prior to the providing.

The providing can comprise directly providing the electrical energy to the at least powered element.

Still further provided is a device comprising: a housing; a powered element disposed on or in the housing; and an impulsive motion producing element housed on or in the housing and operatively connected to the powered element, the impulsive motion producing element producing power upon an application of an impulsive motion to the housing; wherein the impulsive motion producing element comprises one or more masses operatively connected to one or more transition elements for storing potential energy from the impulsive motion.

The one or more transition elements can comprise one or more spring elements.

The impulsive motion producing element can further comprise a power producing element operatively connected to the one or more transition elements for converting the stored potential energy to electrical energy. The power producing element can comprise one or more piezoelectric elements. The power producing element can comprises a magnet and coil.

The impulsive motion can be a shaking of the housing. The impulsive motion can be an impact of the housing against a surface.

Still further yet provided is a method for powering a device. The method comprising: providing an impulsive motion to a housing of the device; storing potential energy from the impulsive motion; and converting the stored potential energy to electrical energy.

The impulsive motion can be a shaking of the housing. The impulsive motion can be an impact of the housing against a surface.

BRIEF DESCRIPTION OF THE DRAWINGS

These and other features, aspects, and advantages of the apparatus of the present invention will become better understood with regard to the following description, appended claims, and accompanying drawings where:

DETAILED DESCRIPTION OF THE PREFERRED EMBODIMENT

Although the present invention is applicable to numerous types of devices, it is particularly useful in the environment of a flashlight. Therefore, without limiting the applicability of the present invention to a flashlight, it will be described in such environment. Those skilled in the art will appreciate that the methods of the present invention can be utilized for other devices, such as cell phones, PDA's, cameras, laptop computers and the like. Where the device includes interior electronics, such as circuit substrates, which may be prone to breakage, the device can also be designed such that the interior electronics are less prone to breakage from impacts. Designing electronic devices to be impact resistant, such as from dropping, are well known in the art.

The primary method of mechanical energy transfer to the generator mechanism described herein is an impulsive motion, such as an impact force. The user is intended to provide the impact (impulsive) force to the device by hitting it on some relatively hard object, hitting it on some relatively hard surface, dropping it repeatedly onto some relatively hard surface, or through other impact inducing actions. The user action results in the storage of certain amount of mechanical energy in the device in the form of potential energy, or kinetic energy, or their combination. The stored potential energy is then transformed into electrical energy through the vibration of the system, which generates varying force on at least one piezoelectric element or the like, which in turn generates varying charges (an AC voltage), which is then harvested by the system electronics using well known techniques, and used to charge a capacitor and/or rechargeable battery and/or directly to provide power, such as to provide light, preferably through an LED or other low power light source. The induced vibration may be axial, in bending, in torsion, or their combination.

Figure 1:
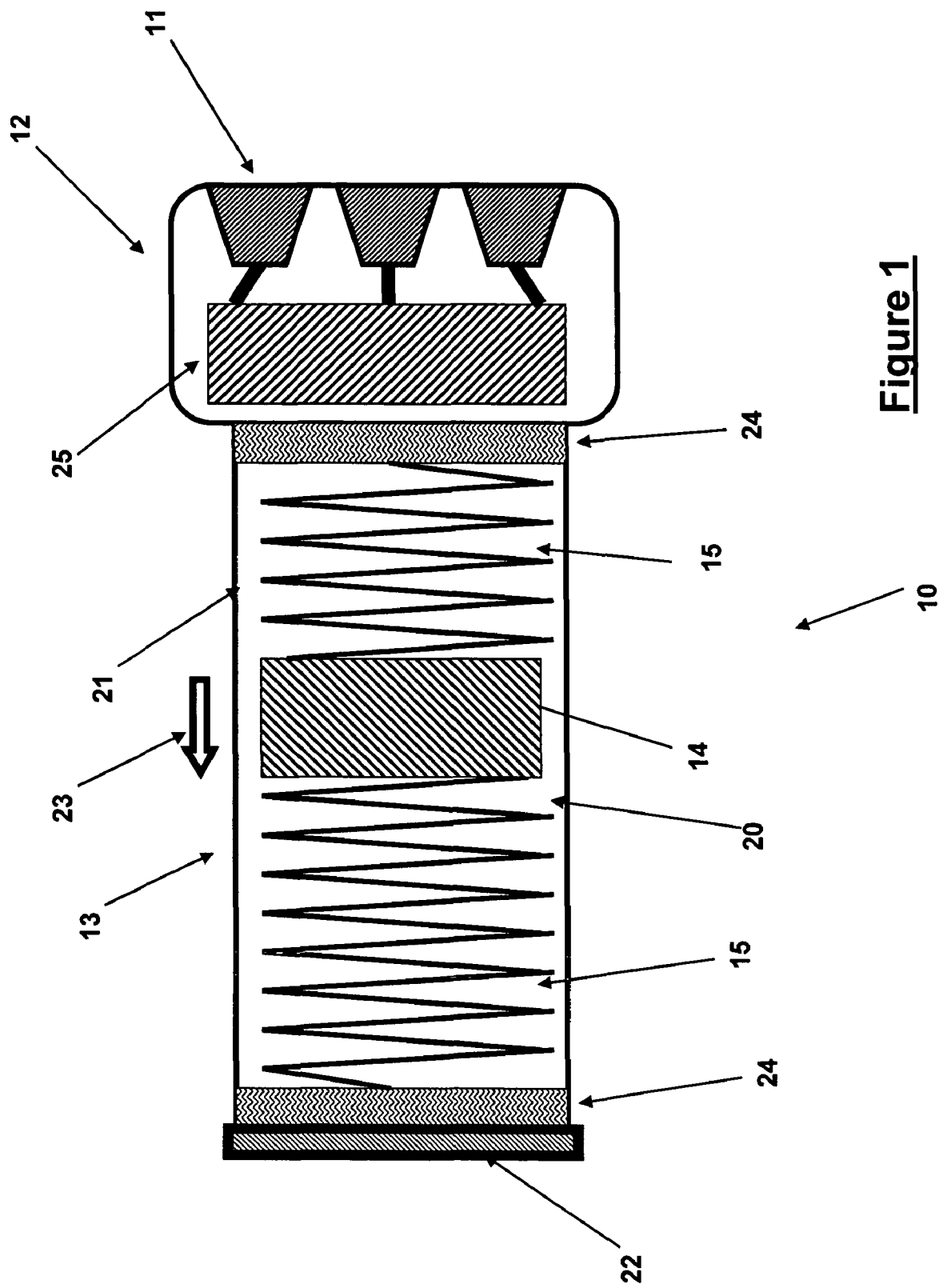
FIG. 1 illustrates a cross sectional schematic view of a first embodiment of an impact powered flashlight.

Referring now to FIG. 1, there is shown a first embodiment of a device using such an impact (or other impulsive motion) to provide power for at least one powered element associated with the device, in the form of a flashlight shown schematically in FIG. 1. The flashlight 10 has a powered element in the form of a light source 11, which can be one or a plurality of LEDs or other low power light source (collectively referred to as the light source 11). The light source 11 can be mounted in a housing 12 that contains the energy harvesting electronics and the electrical energy storage device(s), collectively indicated as element 25. Such energy storage devices are well known in the art, such as low leakage capacitors and/or rechargeable batteries and a detailed description thereof will be omitted for the sake of brevity. The impact force or vibration motion to mechanical energy storage mechanism is preferably positioned in a handle 13, away from the more sensitive electronics 25 and light source 11. The impact force or vibration motion to mechanical energy storage mechanism can comprise an impact power producing element, such as at least one mass-spring unit 20, with at least one relatively rigid mass 14 and at least one transition elements, such as one or more spring elements 15. As discussed below, the impact power producing element also functions with the application of other impulsive motions, such as shaking, either directly or incidental. The housing 21 of the handle and preferably the light source housing 12 are constructed strong enough to resist moderate impact and drops, such as with plastic. A bottom surface 22 of the flashlight can be constructed of a durable material that can withstand repeated impacts, such as one or more high-strength plastics. When the user hits the bottom surface 22 of the handle housing on a relatively rigid surface, the mass 14 is accelerated downwards in the direction of arrow 23 during the duration of the impact. Simply, this occurs since once the handle housing is stopped suddenly during a small period of time Δt (usually a few milliseconds depending on the physical characteristics of the impacting surfaces and on how rigid the impacted structure behaves), then the mass 14, which is free to accelerate, begins to accelerate and continues to accelerate during nearly the same period of time Δt. At the completion of this acceleration period, the mass 14 has reached a certain velocity $V_0$ and has traveled a certain distance $D_0$. If the effective mass 14 of the mass-spring unit 20 is m and the effective spring rate of the mass-spring unit 20 is K, then the total mechanical energy $E_m$ stored in the mass-spring unit 20 as a result of the aforementioned impact (impulse) force is:

$$E_m = 0.5mV_0^2 + 0.5kD_0^2 \quad (1)$$

Following the impact, the mass-spring unit 20 will begin to vibrate. The spring element(s) 15 will then exert a varying force on the piezoelectric elements 24 positioned on at least one end of the spring elements 15, which in turn generate a varying charge with a certain voltage that is harvested by the harvesting and storage electronics 25 and made available to power the light source 11 or other powered element associated with the device. As is known in the art, the piezoelectric elements can be made in stacked form, which are widely available commercially, for low voltage applications. As shown in FIG. 1, the mass 14 can be positioned in between two spring elements 15, each of which can exert a varying force on a corresponding piezoelectric element 24 positioned at two ends of the handle 13. The piezoelectric elements 24 can be electrically connected to the storage electronics 25 or directly to the light source 11 through appropriate wiring in the housing 12.

Figure 2:
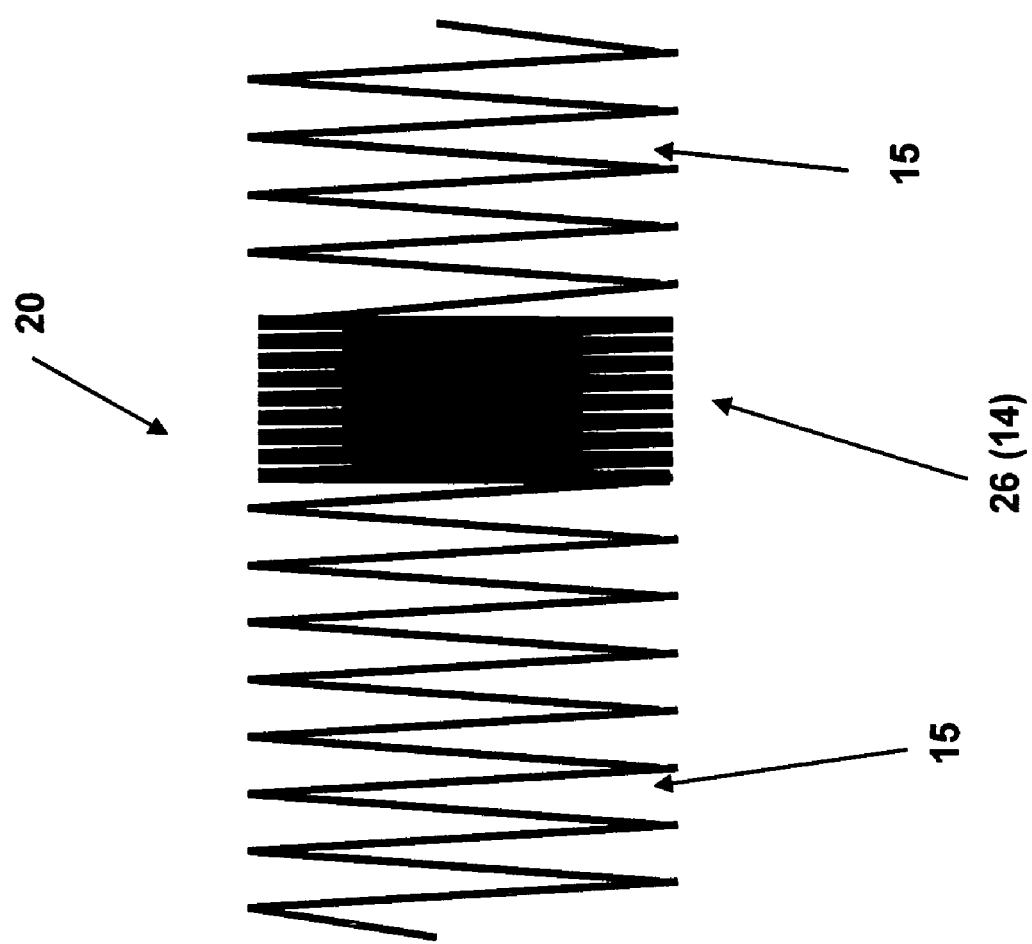
FIG. 2 illustrates a variation of the mass-spring unit of the embodiment of FIG. 1.

The mass 14 can be an integral part of the spring element(s) 15 as shown in FIG. 2. In this configuration, the entire mass-spring unit 20 can be constructed with a single spring wire helically wound with at least one compressed coil section 26, which acts as the relatively rigid mass 14 of the mass-spring unit 20.

Figure 3:
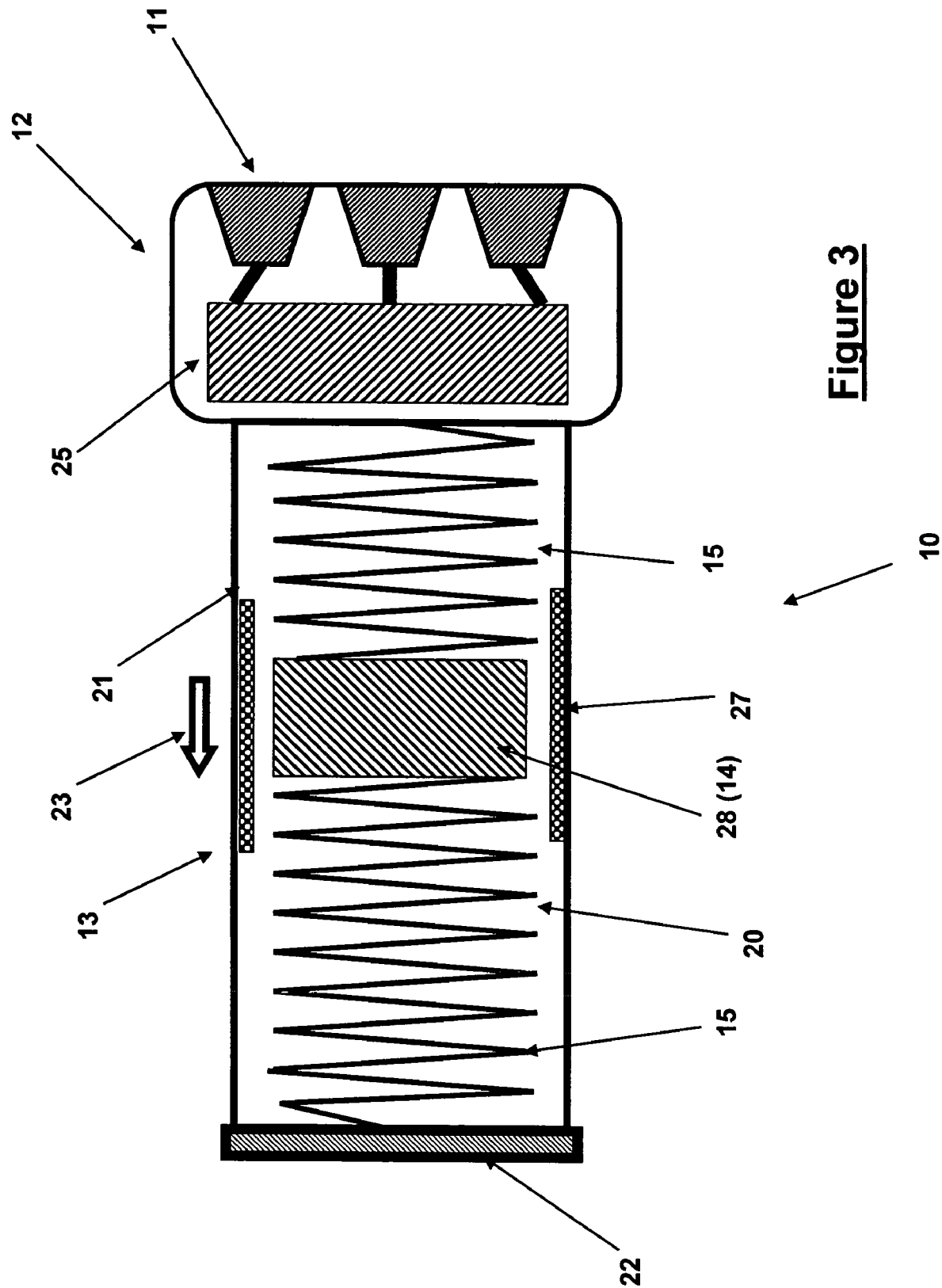
FIG. 3 illustrates a cross sectional schematic view of a second embodiment of an impact powered flashlight.

It will be appreciated by those skilled in the art that coil and magnet type of mechanical to electrical energy generators may also be used instead of the aforementioned piezoelectric elements with the above method of storing mechanical energy due to impact (impulsive) forces for relatively slow transformation into electrical energy. The schematics of one such embodiment is shown in FIG. 3. All elements of this embodiment may be identical to that of the embodiment shown in FIG. 1 with the difference that the piezoelectric elements 24 are replaced with the coil 27 and magnet 28 elements. The magnet 28 can be the mass 14 of the mass-spring unit 20 (and not the coil 27), to eliminate the need to attach wires to the vibrating mass 14. Following the impact or other impulsive motion, the magnet 28 vibrates inside the coil, therefore causing it to generate an AC current, which is then harvested by the harvesting and storage electronics 25.

Figure 4:
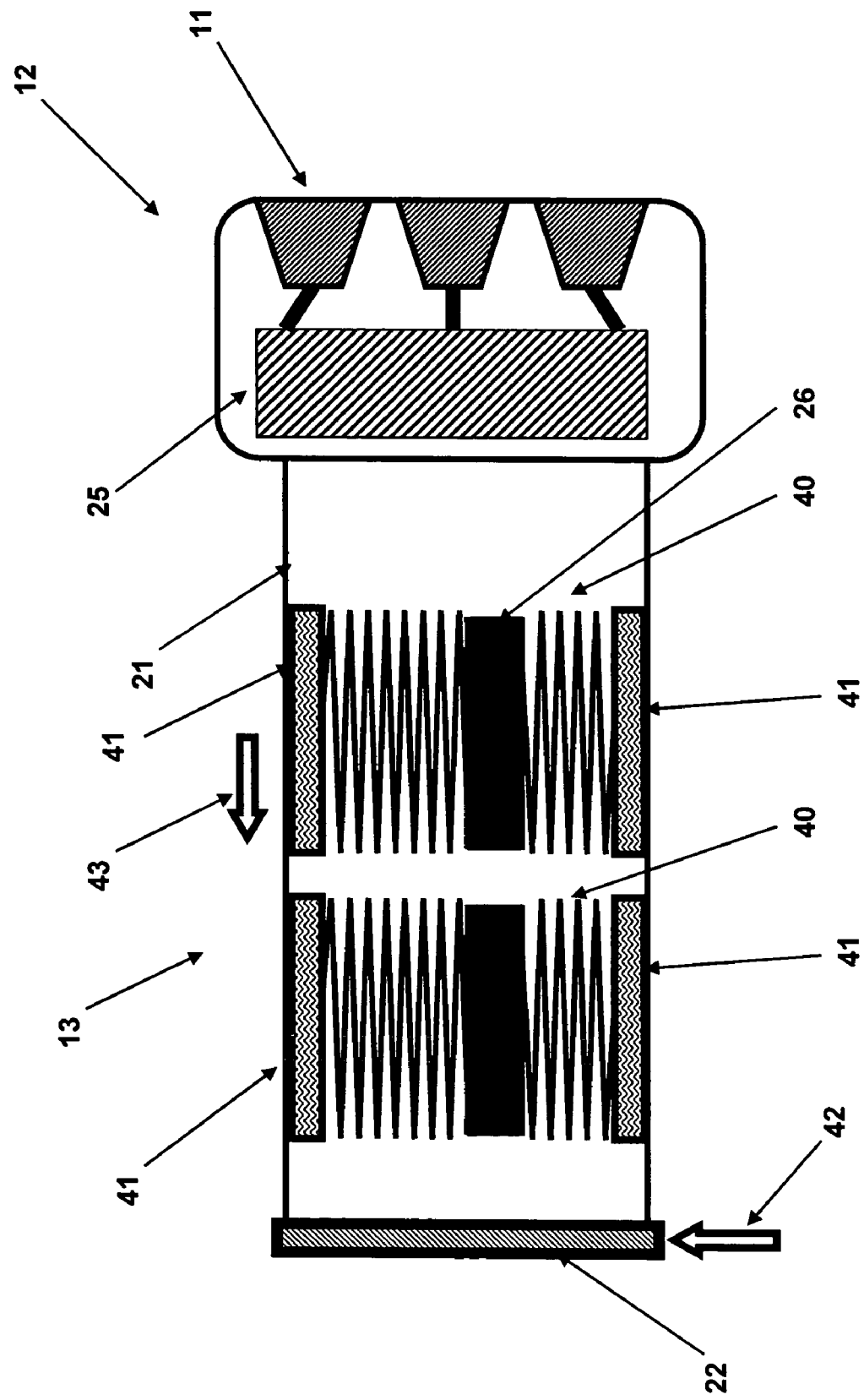
FIG. 4 illustrates a cross sectional schematic view of a third embodiment of an impact powered flashlight.

It is appreciated by those familiar with the art that one or more mass-spring elements can also be mounted perpendicular to the long axis of the flashlight handle to be responsive mostly to an impact or other impulsive motion to the side of the flashlight. The schematic of such an embodiment is shown in FIG. 4. The at least one mass-spring unit 40 (in the schematic of FIG. 4, two of the mass-spring units shown in FIGS. 1 or 2 are used) is similarly attached to piezoelectric elements 41 to harvest the stored mechanical energy during vibration of the mass-spring unit 40 as previously described by the harvesting and storage electronics 25. The lateral impact can be to the more rigid end 22 of the handle 13 in the direction of arrow 43. However, any lateral and/or axial impact or their combination will accelerate the mass 26 of the mass-spring unit 40. It is appreciated by those skilled in the art that the mass-spring unit 40 would similarly respond to an axial impact in the direction of the arrow 42 by vibrating in the axial direction, and the lateral component of the spring force on the piezoelectric element would similarly produce charges that can be harvested by the harvesting and storage electronics 25.

Figure 5:
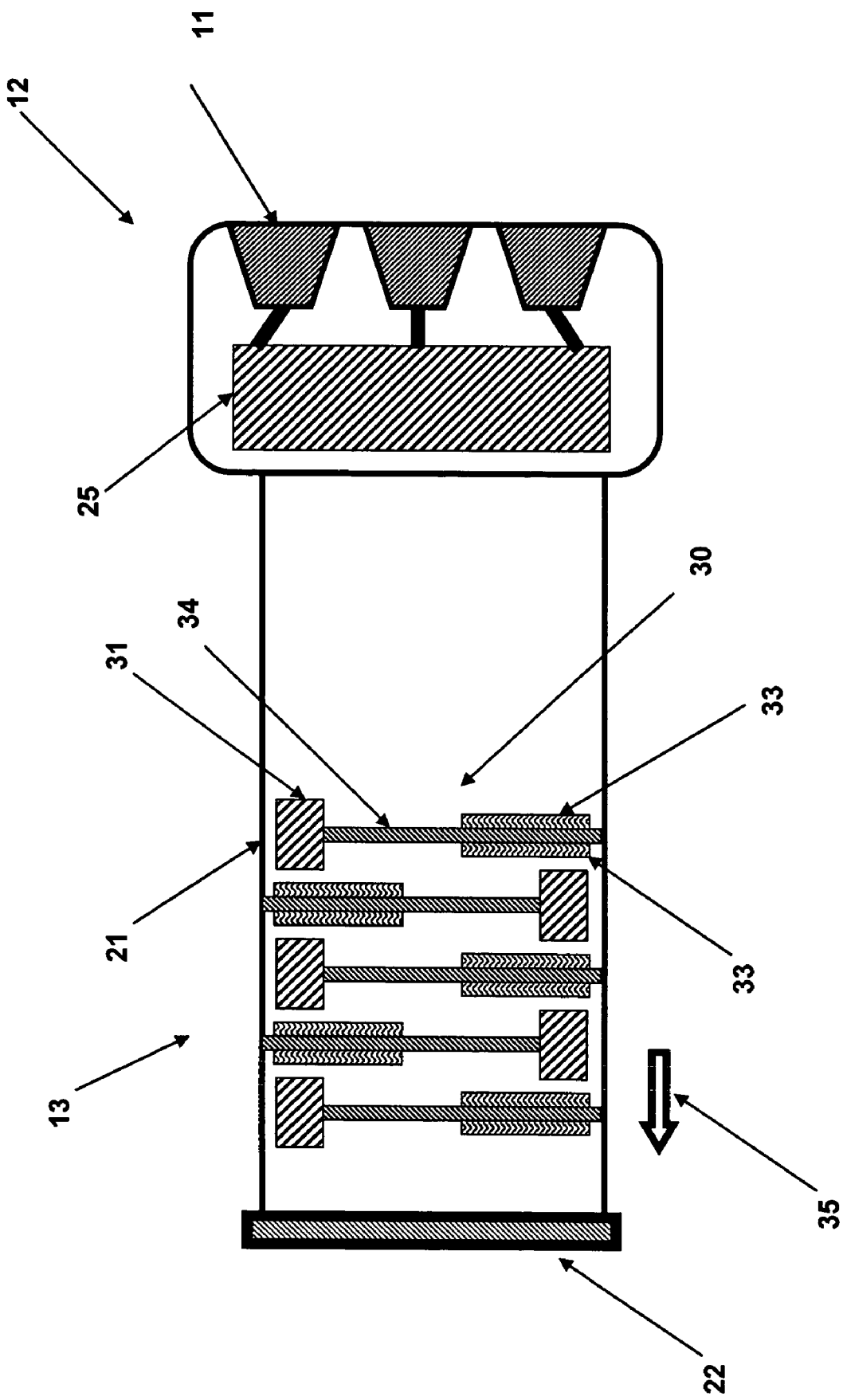
FIG. 5 illustrates a cross sectional schematic view of a fourth embodiment of an impact powered flashlight.

As was previously described, the impact or other impulsive motion induced vibration may be axial (i.e., in the direction of the length of the flashlight), in bending, in torsion, or their combination. When the impact is essentially in the axial direction 35 and generated by hitting the bottom surface of the flashlight on a relatively hard surface, bending deflection can be readily induced as shown schematically in FIG. 5 by at least one cantilever beam generator assembly 30, consisting of a beam 34 that is attached to the housing 21 of the handle 13 of the flashlight, preferably aided by at least one tip mounted mass 31 (the mass can be an integral part of the beam). At least one piezoelectric element 33 is attached to the surface of the beam 34, preferably close to its base (the end attached to the flashlight) so that it is subjected to high tensile strain on one side of the beam 34 and compressive strain on the other side of the beam 34. The varying charge generated due to the applied compressive and tensile strains on the piezoelectric elements is then supplied to and harvested by the harvesting and storage electronics 25. It is appreciated by those familiar with the art that the piezoelectric elements 33 can be pre-stressed in compression so that during the aforementioned vibration they are not subjected to tensile stress since piezoelectric elements can be very brittle and can withstand only small tensile strains.

It is noted that since the disclosed methods and embodiments rely on vibration of mass-spring units, mechanical energy is transferred to the mass-spring units during other flashlight acceleration and deceleration cycles other than those due to impact (impulsive) forces imparted somewhere on the flashlight body. For example, if the flashlight is placed inside a car, the vibration of the car will induce vibration of the flashlight mass-spring unit and thereby generate electrical energy that is stored, preferably in rechargeable batteries, for later use. The same process occurs if a person carries the flashlight in his/her pocket or purse or briefcase, etc., while walking or otherwise moving and would have a charged flashlight for use when needed.

Although the embodiments disclosed herein are discussed as providing electrical energy upon an impact of the device against a surface, then can also provide electrical power upon the application of any other impulsive motion, such as by shaking, which can be directly applied (such as by a person shaking the device with his or her hand) or incidentally applied (such as due to movement while being stored in a car, pocketbook etc.). However, unlike the shaking apparatus of the prior art, transition elements, such as the spring elements are provided for storing potential energy, which is in turn converted to electrical power, such as by the piezoelectric elements or magnet/coil arrangements. A shaking impulsive motion working solely on a movable mass, has limitations as to the frequency by which the mass can vibrate (less than 10 Hz), while the addition of the transition elements, such as the spring elements, can produce much higher frequencies, such as between 10-300 Hz and possibly higher, with the impact impulsive motion generally providing the higher frequencies in the range.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A device comprising:
   a housing having an impact receiving surface on an external portion of the housing;
   a powered element disposed on or in the housing; and
   an impact power producing element housed on or in the housing and operatively connected to the powered element, the impact power producing element producing power upon an impact of the impact receiving surface with another surface;
   wherein the impact power producing element comprises a piezoelectric element, a mass and one or more spring elements connected at a first end to the mass and at a second end to the piezoelectric element such that the impact sets the mass in motion causing the one or more spring elements to exert a force on the piezoelectric element.

2. The device of claim 1, wherein the powered element is a light source.

3. The device of claim 2, wherein the light source is one or more light emitting diodes.

4. The device of claim 1, further comprising one or more of an energy harvesting device and an energy storage device for receiving an input from the impact power producing element and delivering an output to the powered element.

5. The device of claim 1, wherein the impact receiving surface is an end of the housing.

6. The device of claim 1, wherein the impact power producing element comprises two piezoelectric elements and two spring elements each connected at a first end to the mass and each connected at a second end to one of the two piezoelectric elements.

7. The device of claim 1, wherein the mass and one or more spring elements comprise an integral spring winding having one or more spring element portions and a mass portion in which the mass portion is wound more tightly than the one or more spring portions.

8. A flashlight comprising:
   a housing having an impact receiving surface on an external portion of the housing;
   a light source disposed in the housing; and
   an impact power producing element housed in the housing and operatively connected to the light source, the impact power producing element producing power upon an impact of the impact receiving surface with another surface;
   wherein the impact power producing element comprises a piezoelectric element, a mass and one or more spring elements connected at a first end to the mass and at a second end to the piezoelectric element such that the impact sets the mass in motion causing the one or more spring elements to exert a force on the piezoelectric element.

9. A device comprising:
   a housing;
   a powered element disposed on or in the housing;
   a piezoelectric element disposed in the housing and operatively connected to the powered element to provide power to the powered element; and
   a mass-spring unit disposed in the housing, the mass-spring unit comprising a mass and at least one spring, the at least one spring being connected at one end to the mass and at another end to the piezoelectric element, the piezoelectric element producing power upon an impact of at least a portion of the housing with another surface to vibrate the mass-spring unit and exert a force on the piezoelectric element.

10. The device of claim 9, wherein the piezoelectric element comprises two piezoelectric elements and the mass-spring unit comprises two spring elements each connected at one end to the mass and each connected at another end to one of the two piezoelectric elements.

11. The device of claim 9, wherein the housing comprises an impact receiving surface on an external portion of the housing, the piezoelectric element producing power upon an impact of the impact receiving surface with another surface.

12. A flashlight comprising:
    a housing;
    a light source disposed in the housing;
    a piezoelectric element disposed in the housing and operatively connected to the light source to provide power to the light source; and
    a mass-spring unit disposed in the housing, the mass-spring unit comprising a mass and at least one spring, the at least one spring being connected at one end to the mass and at another end to the piezoelectric element, the piezoelectric element producing power upon an impact of at least a portion of the housing with another surface to vibrate the mass-spring unit and exert a force on the piezoelectric element.

13. The flashlight of claim 12, wherein the piezoelectric element comprises two piezoelectric elements and the mass-spring unit comprises two spring elements each connected at one end to the mass and each connected at another end to one of the two piezoelectric elements.

14. The flashlight of claim 12, wherein the housing comprises an impact receiving surface on an external portion of the housing, the piezoelectric element producing power upon an impact of the impact receiving surface with another surface.

* * * * *